United States Patent [19]

Fawkes

[11] Patent Number: 4,480,275
[45] Date of Patent: Oct. 30, 1984

[54] CONSTANT CURRENT BIASED HEAD DRIVER

[75] Inventor: John S. Fawkes, San Jose, Calif.

[73] Assignee: Ampex Corporation, Redwood City, Calif.

[21] Appl. No.: 364,737

[22] Filed: Apr. 2, 1982

[51] Int. Cl.³ ............................ G11B 5/09; G11B 5/02
[52] U.S. Cl. .................................... 360/46; 360/68
[58] Field of Search ............................ 360/46, 68, 66; 330/252, 259, 260, 291

[56] References Cited

U.S. PATENT DOCUMENTS

| | | | |
|---|---|---|---|
| 3,480,739 | 11/1969 | Kinkel | 360/46 |
| 4,081,845 | 3/1978 | Brairberg | 360/68 |
| 4,314,289 | 2/1982 | Haynes | 360/68 |
| 4,342,006 | 7/1982 | Ishigaki | 360/68 |
| 4,349,848 | 9/1982 | Ishii et al. | 360/68 |
| 4,386,378 | 5/1983 | Guisinger | 360/68 |

FOREIGN PATENT DOCUMENTS 70912  5/1980  Japan .................................... 360/68

OTHER PUBLICATIONS

"Design of Magnetic Recording & Play Back Amplifiers" S. L. Sah et al., IEE-IERE Proceedings, vol. #2, Mar. 1975.

Primary Examiner—Vincent P. Canney
Attorney, Agent, or Firm—Elizabeth E. Strnad; Joel D. Talcott

[57] ABSTRACT

A constant current source is combined with a fixed AC bias circuit to supply a constant current biased drive signal to a control track, an audio, etc., record head. A voltage doubler bridge configuration may be used to double the current to the head.

12 Claims, 6 Drawing Figures

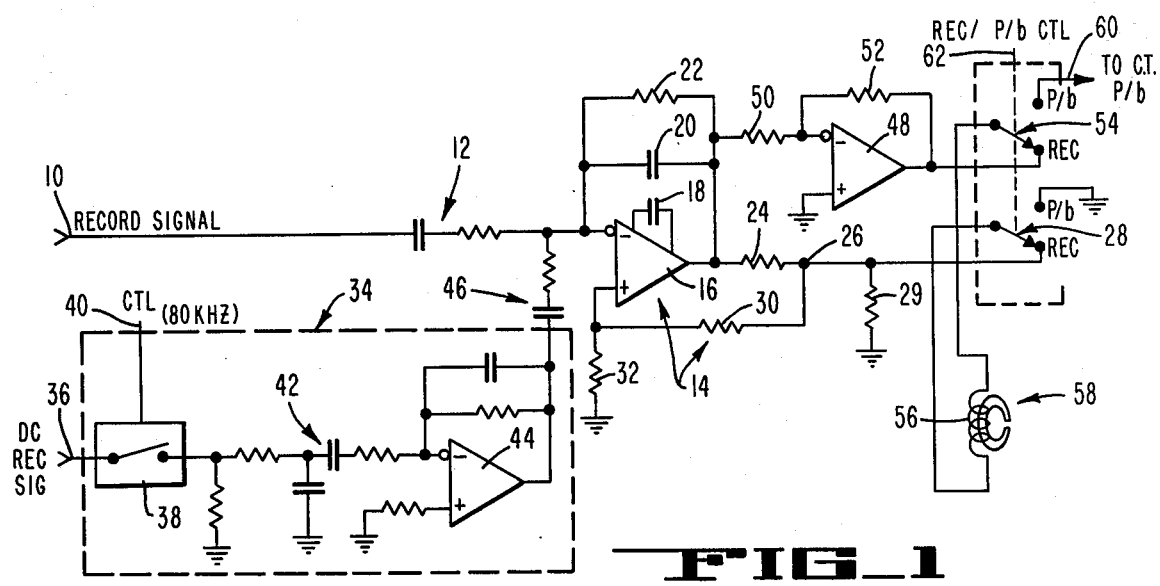
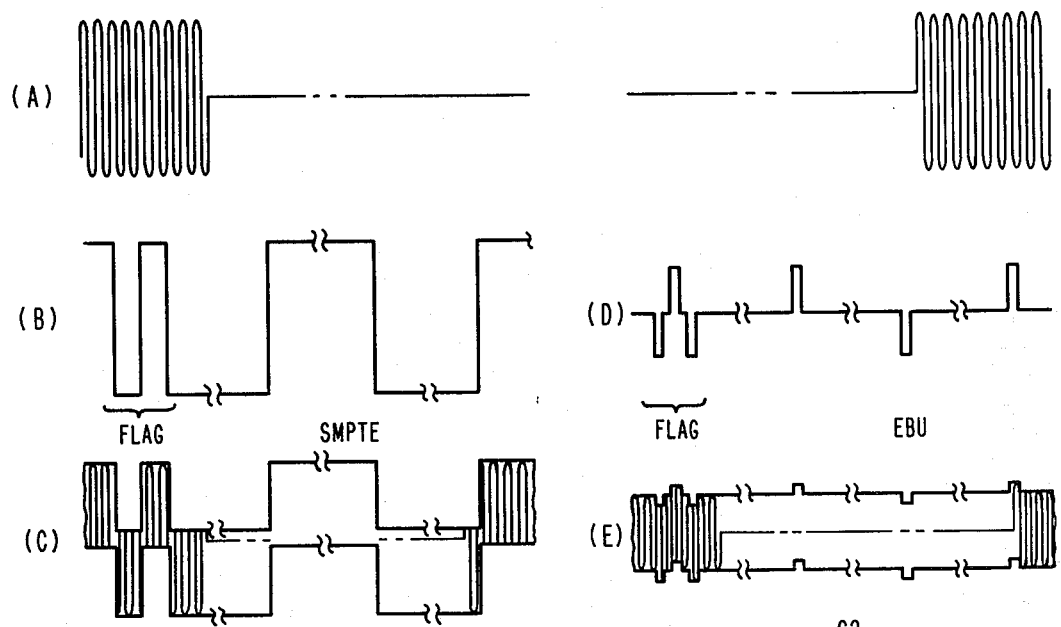
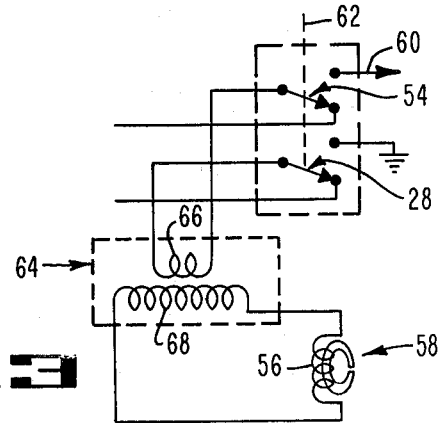

CONSTANT CURRENT BIASED HEAD DRIVER

BACKGROUND AND SUMMARY OF THE INVENTION

The present invention is related to control track recording, and particularly to an improved audio or control track record head drive circuit.

In the field of videotape recorders, and particularly when recording television via a helican scan format, it is standard practice to record a control track along with selected audio tracks on the tape. The control track provides tape position signals for the capstan servo, the reel servo and for the tape timer circuit, and also provides information for the identification and phase control of color frame/sync sequences. In SMPTE or EBU type C helical recording formats, audio tracks identified as A1 and A2 are recorded adjacent the video along the top edge of the tape. The control track is longitudinally recorded adjacent the helically recorded video, along the bottom edge of the tape. A third audio track A3 is recorded adjacent to the control track along the bottom-most edge of the tape. The spacing between track A3 and the control track is twice as much as is the spacing between the tracks A1 and A2.

The SMPTE and EBU systems offer three format options which affect the tracks recorded near the tape bottom edge. The first or basic NTSC or PAL format option has no sync track, whereby only the control track and the audio track A3 are recorded. A second NTSC or PAL format option includes the sync track, which is recorded via helical sync heads in the space between the control and A3 tracks. Thus information occurring during vertical interval drop-out time is recorded and played back by the sync track heads. A third format option for PAL with EBU audio track A4, allows PAL/SECAM machines equipped for EBU audio, to record the fourth audio track in the space between the control track and the track A3 which is reserved for the sync information in the second option.

Different television recording formats use different schemes for recording the control track. The SMPTE type C format records a saturated control track which has a square wave fundamental. The EBU type C format uses a biased pulse signal. The former scheme provides a control track which saturates the tape in opposite polarities with rather large amplitude 30 Hertz (Hz) signals. The latter scheme uses less energy, and eliminates the low frequencies associated with the saturated signal. This minimizes crosstalk between adjacent channels, while making the addition of a high quality audio A4 track practial in the EBU system.

In both systems there exists a problem of crosstalk between the tracks when recording the control track and attempting to read out the audio track A3. In the SMPTE format wherein the control track is recorded as a saturated signal of relatively large amplitude, the problem of crosstalk must be taken into account, even though the spacing is relatively large between the control track and the audio track A3. In the EBU format, the resulting decrease in space between the control track and the audio track A4, requires precautions to minimize crosstalk between the tracks when recording the control track and playing back the track A4, even though the EBU control track signal uses a biased small pulse signal.

Accordingly, in recording a control track, there are various conditions and associated problems which must be dealt with. For example, the control track drive circuit should properly record the control signal to allow its efficient and faithful reproduction upon playback, and should minimize or delete entirely any objectionable level of crosstalk between the control track and the adjacent audio track. Further, the drive circuit should not be affected by a change in inductive reactance of the driven head, which may vary between heads as much as $\pm 20\%$. In high qualilty audio head applications, the drive circuit should not generate any phase changes in the response characteristics of the recorded audio signal.

There also are various practical considerations which should be taken into account in the design of a control track, or an audio track, head drive circuit. Typical of such considerations are that the circuit be relatively simple in design, and require as few "tweaking" adjustments as possible when performing the final system test of the apparatus. Adjustments in a driver circuit generally are interreactive and therefore require excessive and cumbersome tweaking in order to properly adjust them to the correct proportions.

In keeping with the above considerations, various circuits have been developed in the art to provide control track head driver circuits which provide the preferred control track parameters as well as the preferred circuit features. Typical of such control track drive circuit is that used in the video production recorder VPR-2B manufactured by Ampex Corporation, Redwood City, California, which employs an "interrupted" bias control track drive circuit for the EBU format, and a now-biased saturated squarewave drive circuit for the SMPTE format.

The former circuit circumvents the problems usually associated with conventional additive bias schemes which employ, for example, a bias transformer, separate feeds for bias drive and record drive, and two level potentiometers which require careful tweaking adjustments to provide the correct drive proportions. It follows that the system is readily simple to set up with a minimum of tweaking adjustments.

However, the scheme used to bias the control track record signal, employs the interrupted bias/record signal of previous mention, which causes an increase in interchannel crosstalk. The bias scheme employs a squarewave oscillator directly coupled to the drivers of the record head, which generates a signal at a bias rate of, for example, 125 kiloHertz (kHz). After every eight microseconds (us) interval, the bias is interrupted for 125 us to provide a record signal of the same amplitude as the bias signal and of alternating polarity. The result is a continuous squarewave formed of eight microseconds of AC bias, interspersed with 125 us record signals of alternate polarity. This composite signal is recorded on the tape as the control track signal, in the EBU system. The playback system is fairly insensitive to the very fast bias transitions, but is very sensitive to the slow transistions and thereby detects the latter as the control track signal. However, the actual recorded signal has a very high record current component which, in turn, causes excessive crosstalk between the control track and the audio tracks A3 and A4.

The present invention provides a drive circuit for a control track record head, which overcomes the various disadvantages of the drive circuits of previous mention. To this end, a constant current source is combined with a fixed AC bias circuit, to provide an additive bias head driver circuit which derives all the advantages, but none of the disadvantages, of present additive or "interrupted" bias schemes. More particularly, the circuit does not require a coupling transformer and thus circumvents the expense, the unreliability and the associated tweaking adjustments caused by its use. The constant current source receives a fixed bias from an AC filter bias means, along with the selected record signal, and supplies a constant current biased drive signal to the control track record head. Inverting amplifier means also are coupled to the record head. The combined configuration of the constant current source and the inverting amplifier means defines a voltage doubler bridge circuit, which supplies the head with twice the driving current which would be provided by a conventional single-ended configuration.

Accordingly, it is an object of the invention to drive a record head using fixed AC bias and fixed recording level signals.

A further object is to provide an improved circuit for driving a record head which does not require cumbersome tweaking adjustments.

Another object is to provide a reactive load driver circuit which is unaffected by differences in the load inductive reactance.

Still another object is to provide an improved driver circuit which requires half the usually required voltage.

A still further object is to provide an improved driver circuit for recording high quality audio signals as well as control track signals.

BRIEF DESCRIPTION OF THE DRAWINGS

FIG. 1 is a schematic diagram depicting an implementation of the invention combination.

FIGS. 2A to 2E is a graph illustrating waveforms generated at various points along the circuit of FIG. 1, for SMPTE and EBU television systems.

FIG. 3 is a schematic diagram of a variation in the circuit of FIG. 1.

DESCRIPTION OF THE PREFERRED EMBODIMENTS

Although the circuit is described herein relative to a control track head driving circuit, it is to be understood that the circuit may be utilized in other situations, i.e., for driving high quality audio record heads, etc.

Referring to FIG. 1, a control track recording signal is provided at an input 10. The record signal may comprise, by way of example only, a squarewave signal, a biased positive and negative pulse signal, etc., such as employed in SMPTE and EBU type C videotape recorders to record a control track on a magnetic tape. The record signal at input 10 is AC coupled as at 12 to the negative input of an operational amplifier 16 of less than unity gain, configured to define a constant current source 14. The latter configuration generally resembles what is commonly known in the art as a Howland current source. A capacitor 18 coupled from pin 1 to pin 8, and a capacitor 20 coupled from the negative input to the output, of the operational amplifier 16, helps in preventing oscillations. A resistor 22 is coupled across the capacitor 20. An output resistor 24 is coupled to the output of the operational amplifier 16 and thence, via a junction 26, to a record contact of a switch 28. A resistor 29 is coupled from the junction 26 to ground and also helps to prevent oscillations in the circuit. A positive feedback loop is provided back to the positive input of the operational amplifier 16 via the junction 26 and a resistor 30. The positive input also is coupled to ground via a resistor 32. As may be seen, the operational amplifier 16 thus is configured as a constant current source 14, utilizing positive feedback via the resistors 30, 32 to keep the current flowing through the output resistor 24 constant regardless of any reactive changes in the load coupled to the source.

Additive fixed bias is provided by coupling the output from an AC filter bias means 34 to the negative input of the operational amplifer 16, along with the record signal from input 10. To this end, DC record current is supplied via an input 36 to a chopper circuit 38. The chopper is controlled by a clock of, for example, 80 kHz, on a line 40. The chopped output is fed to a filter 42 which, in turn, supplies the filtered signal to the negative input of an operational amplifier 44. The amplifier 44 is AC coupled as at 46 to the negative input of the operational amplifier 16, along with the record signal. The AC coupling at 12 and 46 help prevent the generation of oscillations.

An inverting amplifier 48 is coupled at its negative input to a junction of capacitor 20 and resistor 22, via a resistor 50. The positive input is coupled to ground. The output of the inverting amplifier 48 is coupled back to the negative input thereof via a resistor 52. The output is also coupled to a record contact of a switch 54.

The common terminal of the switch 28 is coupled to one end of a coil 56 of a control track record head 58, and the common terminal of switch 54 is coupled to the other end of the coil. A playback contact of the switch 28 is coupled to ground. A playback contact of the switch 54 provides an output 60, which supplies a playback signal from the control track head 58 to a control track playback circuit (not shown) when the system is in the playback mode. The switches 28 and 54 are activated in unison via suitable switching control means (not shown) via a control line 62, in response to record or playback commands from the system.

When in the record mode, the record head 58 is not driven by a single-ended circuit as is generally done. Instead, the inverting amplifier 48 provides an output which is always out of phase with the output of the constant current source 14. Thus the inverting amplifier 48, which has unity gain, provides one half of a "bridge" drive circuit. The output of the constant current source 14 comprises the other half of the bridge. The two outputs are coupled via the switches 28, 54 to the head 58, thereby doubling the drive current fed thereto. Thus, the drive circuit is supplied with ±12 volts but produces a voltage differential that would require power supplies of ±24 volts if a single-ended drive circuit were used.

Referring also to FIG. 2, the DC record current level on input 36 is chopped and filtered to provide the AC bias signal shown in FIG. 2A. The record signal on input 10 for recording a control track in the SMPTE system, is depicted in FIG. 2B, and is added to the AC bias via the constant current source 14. The latter provides a resulting constant current drive signal with fixed bias as depicted in FIG. 2C, which is used to drive the record head 58.

Likewise, in an EBU system, the corresponding record signal on input 10, is depicted in FIG. 2D. The constant current source 14 combines the fixed AC bias signal with the EBU record signal, and supplies a constant current signal depicted in FIG. 2E, for driving the record head 58.

FIG. 3 depicts an alternate scheme for coupling the outputs of the operational amplifier 16 and the inverting amplifier 48 to the coil 56 of the head 58, viz., via a step-up transformer 64. A primary winding 66 is connected to the common terminals of switches 28, 54, and a secondary winding 68 is coupled across the coil 56. The transformer 64 provides a larger drive current capability which is advantageous when driving high quality audio record heads. The advantage of using the step-up transformer is the circuits ability to drive higher bias frequencies into higher impedance heads. This need often arrises in videotape recorders or in professional applications wherein the record head is used as a playback head as well.

What is claimed is:

1. A circuit, comprising:
   a reactive load;
   a fixed AC bias source;
   a record signal source;
   constant current source means responsive to the two sources for supplying the reactive load with a constant current biased drive signal; and
   a bridge means integral with the constant current source means and cooperative therewith to double the available signal supplied to the reactive load.

2. The circuit of claim 1 wherein the constant current source means include
   operational amplifier means with positive feedback coupled at its negative input to the fixed AC bias and the record signal sources.

3. The circuit of claim 2 wherein the bridge means include;
   inverting amplifier means operatively coupled at its input to the operational amplifier means; and
   wherein the outputs of the inverting amplifier means and of the operational amplifier means are coupled across the reactive load.

4. The circuit of claim 3 wherein the fixed AC bias source includes:
   a DC record signal source;
   a chopper circuit for chopping the DC record signal at a selected bias high frequency; and
   means coupled to the chopper circuit for supplying the fixed AC bias to the operational amplifier means.

5. The circuit of claim 3 further including;
   AC coupling means for coupling the fixed AC bias and the record signal to the operational amplifier means.

6. The circuit of claim 3 further including;
   a resistor/capacitor coupled across the operational amplifier means negative input and output;
   said inverting amplifier means including an operational amplifier coupled at its negative input to the resistor/capacitor, and at its output to one end of the load; and
   said operational amplifier means being coupled at its output to the other side of the load.

7. A circuit for driving a head, comprising;
   operational amplifier means with positive feedback coupled to receive a given record signal and coupled at its output to the head;
   fixed AC bias means coupled to the operational amplifier means; and
   inverting amplifier means coupled to the operational amplifier means and cooperative therewith to double the current through the head.

8. The circuit of claim 7 wherein the operational amplifier means include;
   an output resistor coupled at the output thereof,
   a feedback resistor coupled from the output resistor back to the positive input of the operational amplifier means; and
   a third resistor coupled from the positive input to ground;
   wherein the feedback and third resistors maintain the voltage drop across the output resistor constant.

9. The circuit of claim 7 wherein the fixed AC bias means include;
   means for generating an AC square wave of relatively high frequency;
   means for forming an AC bias sinewave of fixed amplitude from the square wave.

10. A circuit for driving a record head, comprising;
    a source of record signal;
    an operational amplifier coupled at its negative input to the source having positive feedback for generating a constant current drive signal;
    bias means for supplying a fixed AC bias voltage to the negative input;
    an inverting amplifier for generating an output which is always out of phase with the constant current drive signal; and
    said operational amplifier and inverting amplifier outputs being coupled to respective sides of the record head.

11. The circuit of claim 10 including;
    step-up transformer means coupled between the record head and the outputs of the operational amplifier and inverting amplifier.

12. A circuit for driving a record head, comprising:
    a source of record signal;
    a fixed AC bias source; and
    a constant current source comprising an operational amplifier with positive feedback coupled at its negative input to the fixed AC bias and record signal sources to supply a constant current biased drive signal to said record head.

* * * * *